United States Patent
Sunaga et al.

(10) Patent No.: US 10,224,261 B2
(45) Date of Patent: Mar. 5, 2019

(54) ELECTRONIC COMPONENT MOUNTING STRUCTURE

(71) Applicant: CALSONIC KANSEI CORPORATION, Saitama (JP)

(72) Inventors: Hideki Sunaga, Saitama (JP); Yuuzou Shimamura, Saitama (JP); Norio Fujii, Saitama (JP); Yuuji Daimon, Saitama (JP)

(73) Assignee: CALSONIC KANSEI CORPORATION, Saitama (JP)

(*) Notice: Subject to any disclaimer, the term of this patent is extended or adjusted under 35 U.S.C. 154(b) by 0 days.

(21) Appl. No.: 15/518,942

(22) PCT Filed: Sep. 4, 2015

(86) PCT No.: PCT/JP2015/075194
§ 371 (c)(1),
(2) Date: Apr. 13, 2017

(87) PCT Pub. No.: WO2016/067748
PCT Pub. Date: May 6, 2016

(65) Prior Publication Data
US 2017/0243801 A1 Aug. 24, 2017

(30) Foreign Application Priority Data
Oct. 31, 2014 (JP) ................................ 2014-223380

(51) Int. Cl.
*H05K 7/20* (2006.01)
*H01L 23/367* (2006.01)
(Continued)

(52) U.S. Cl.
CPC ........ *H01L 23/3675* (2013.01); *H01L 23/293* (2013.01); *H01L 23/3114* (2013.01);
(Continued)

(58) Field of Classification Search
None
See application file for complete search history.

(56) References Cited

U.S. PATENT DOCUMENTS 8,929,073 B2* 1/2015 Suzuki .................. H01L 23/427
165/104.21
9,166,083 B2* 10/2015 Meinel ................. H05K 1/0201
(Continued)

FOREIGN PATENT DOCUMENTS

JP 4-4779 1/1992
JP 2004-146476 5/2004
(Continued)

OTHER PUBLICATIONS

International Search Report dated Dec. 8, 2015 in International (PCT) Application No. PCT/JP2015/075194.

*Primary Examiner* — Courtney L Smith
(74) *Attorney, Agent, or Firm* — Wenderoth, Lind & Ponack, L.L.P.

(57) ABSTRACT

An electronic component mounting structure includes a terminal of an electronic component package and a chip heat radiating member. The terminal is soldered on a land of an electronic substrate and the chip heat radiating member is soldered on a back surface of the electronic component package. The chip heat radiating member is covered by a packaging resin. A metallic heat radiating pattern integrally includes a pattern extension part that protrudes from the electronic component package, such that at least a part of the metallic heat radiating pattern is formed so as to be larger than the electronic component package. The pattern extension part is configured to guide excessive solder to an outside of the electronic component package.

4 Claims, 5 Drawing Sheets

(51) Int. Cl.
  *H01L 23/29* (2006.01)
  *H01L 23/31* (2006.01)
  *H01L 23/495* (2006.01)
  *H05K 1/02* (2006.01)
  *H05K 1/18* (2006.01)
  *H05K 3/34* (2006.01)
  *H01L 23/498* (2006.01)

(52) U.S. Cl.
  CPC ........ *H01L 23/367* (2013.01); *H01L 23/3677* (2013.01); *H01L 23/49541* (2013.01); *H05K 1/0203* (2013.01); *H05K 1/181* (2013.01); *H05K 3/3494* (2013.01); *H05K 7/20* (2013.01); *H01L 23/49548* (2013.01); *H01L 23/49822* (2013.01); *H01L 2924/0002* (2013.01); *H01L 2924/181* (2013.01); *H05K 2201/10628* (2013.01); *H05K 2201/2081* (2013.01)

(56) References Cited

U.S. PATENT DOCUMENTS

| | | | | |
|---|---|---|---|---|
| 2001/0017964 | A1* | 8/2001 | Setoguchi | G02B 6/421 385/88 |
| 2003/0189814 | A1* | 10/2003 | Kato | H01L 23/544 361/715 |
| 2004/0080042 | A1* | 4/2004 | Macomber | H01L 23/367 257/718 |
| 2007/0001297 | A1* | 1/2007 | Higasa | H05K 1/111 257/723 |
| 2010/0110639 | A1* | 5/2010 | Ishida | H02S 40/345 361/712 |

FOREIGN PATENT DOCUMENTS

| | | |
|---|---|---|
| JP | 2005-44968 | 2/2005 |
| JP | 2006-303392 | 11/2006 |
| JP | 2008-205101 | 9/2008 |
| JP | 2012-195546 | 10/2012 |
| JP | 2014-75573 | 4/2014 |

* cited by examiner

ELECTRONIC COMPONENT MOUNTING STRUCTURE

CROSS-REFERENCE TO RELATED APPLICATION

The present application is based on and claims priority from Japanese Patent Application No. 2014-223380, filed on Oct. 31, 2014, the disclosure of which is hereby incorporated by reference in its entirety.

TECHNICAL FIELD

This disclosure is related to an electronic component mounting structure.

BACKGROUND ART

An electronic device includes a several electronic components. Such electronic components are mounted on an electronic substrate and are installed inside the electronic device (see JP 2012-195546 A, for example).

In a conventional electronic component mounting structure for an electronic substrate, as illustrated in FIG. 5, terminals 2 projected from (one of or some of) side parts 1a-1d of an electronic component package 1 are disposed on lands 4, and the terminals 2 are soldered thereon by a reflow method. Here, the lands 4 are provided on the electronic substrate 3. Further, a chip heat radiating member 5, which is provided on a back surface of the electronic component package 1, is placed on a metallic heat radiating pattern 6 provided on the electronic substrate 3, and is soldered thereon by the reflow method.

Technical Problem

However, the above-mentioned electronic component mounting structure has a following deficiency. That is to say, if the amount of solder supplied between the chip heat radiating member 5 and the metallic heat radiating pattern 6 is excessively large, the excessive solder protrudes from the electronic component package 1 and may create a solder ball 13. The solder ball 13 may then contact the terminals 2 and/or the lands 4, resulting in a short circuit.

SUMMARY

A main object of this disclosure is, therefore, to cure the above deficiency.

Solution to Problem

In order to achieve the object, an electronic component mounting structure according to this disclosure includes a terminal that is projected from a side part of an electronic component package, and a chip heat radiating member that is provided on a back surface of the electronic component package. The terminal is placed on a land provided on an electronic substrate and is soldered thereon by a reflow method. The chip heat radiating member is placed on a metallic heat radiating pattern provided on the electronic substrate and is soldered thereon by the reflow method. The chip heat radiating member is formed to be in a size that is covered from all directions by a packaging resin, the packaging resin forming the electronic component package. The metallic heat radiating pattern integrally includes a pattern extension part that is connected to the metallic heat radiating pattern and protruded from the electronic component package, such that at least a part of the metallic heat radiating pattern is formed to be larger than the electronic component package, and the pattern extension part guides excessive solder to outside of the electronic component package.

DESCRIPTION OF EMBODIMENT

Hereinafter, an embodiment of this disclosure will be described with reference to the drawings. FIGS. 1 to 4D are explanatory views for explaining the embodiments.

First Embodiment

Hereinafter, a structure of the embodiment will be described.

An electronic device uses several electronic components. These electronic components are mounted on an electronic substrate and installed inside the electronic device.

Figure 1:
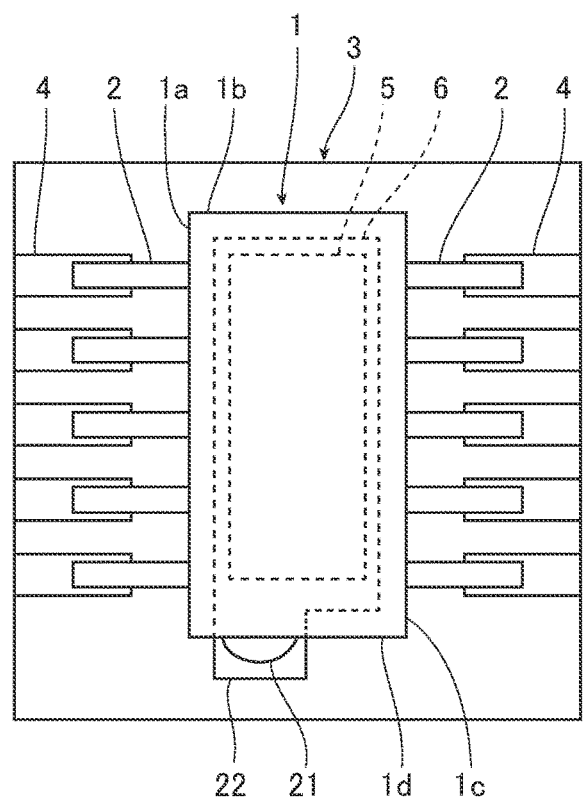
FIG. 1 is a plan view illustrating an electronic component mounting structure according to an embodiment of this disclosure.
Figure 2:
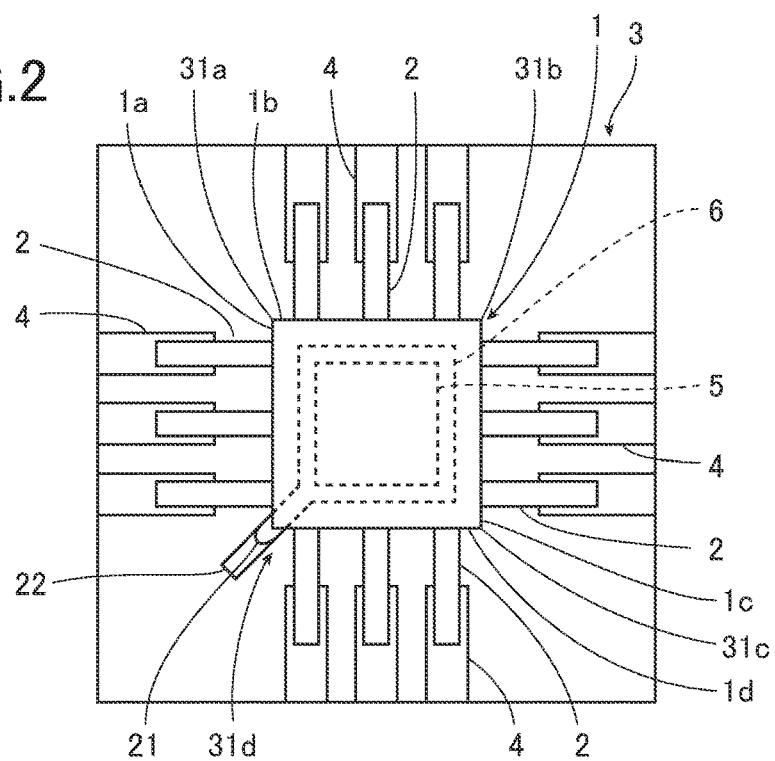
FIG. 2 is a plan view illustrating an electronic component mounting structure of a variation of FIG. 1.

In an electronic component mounting structure for an electronic substrate, as illustrated in FIGS. 1 and 2, a terminal 2 is projected from at least one of side parts 1a-1d of an electronic component package 1. The terminal 2 is then placed on a land 4 provided on an electronic substrate 3 and soldered thereon by a reflow method. Further, a chip heat radiating member 5 is provided on a back surface of the electronic component package 1. The chip heat radiating member 5 is then placed on a metallic heat radiating pattern 6, which is provided on the electronic substrate 3, and is soldered thereon by the reflow method.

Here, the electronic component package 1 covers, for example, a semiconductor chip including an integrated circuit such as an IC and an LSI, with a packaging resin. The electronic component package 1 generally has a substantially rectangular shape in a plan view. The terminals 2 are projected from a pair of the side parts 1a, 1c of the rectangular-shaped electronic component package 1 (see FIG. 1) or two pairs of the side parts 1a-1d thereof (see FIG. 2).

Figure 3A:
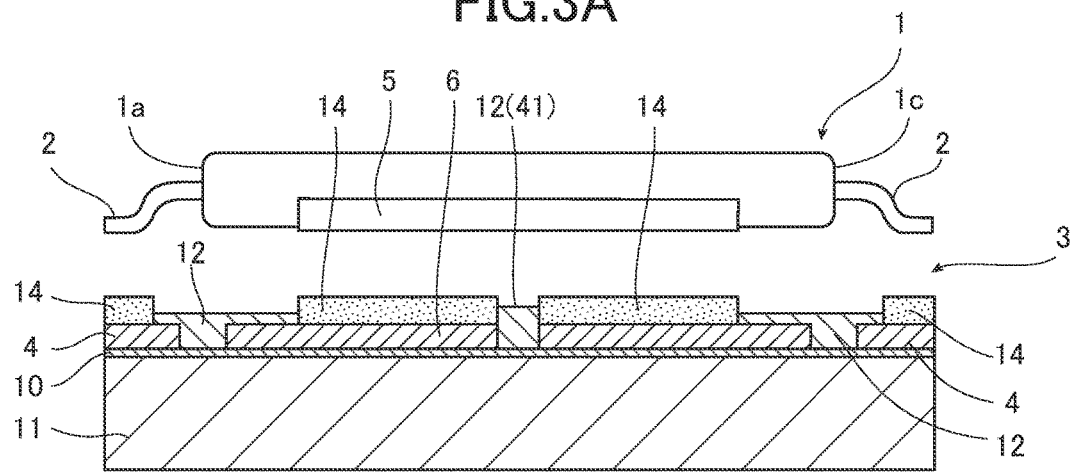
FIG. 3A is a cross-sectional view of the electronic component mounting structure before installing an electronic component package on an electronic substrate.
Figure 3B:
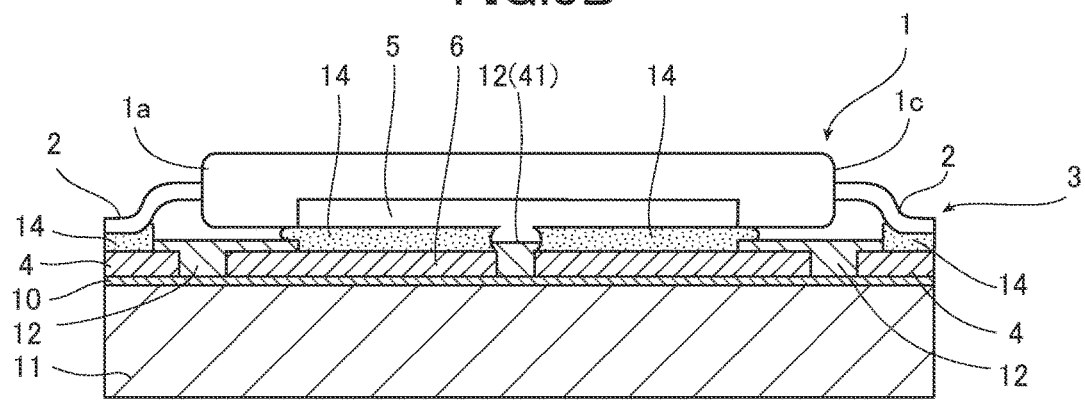
FIG. 3B is a cross-sectional view of the electronic component mounting structure when installing the electronic component package on the electronic substrate.
Figure 3C:
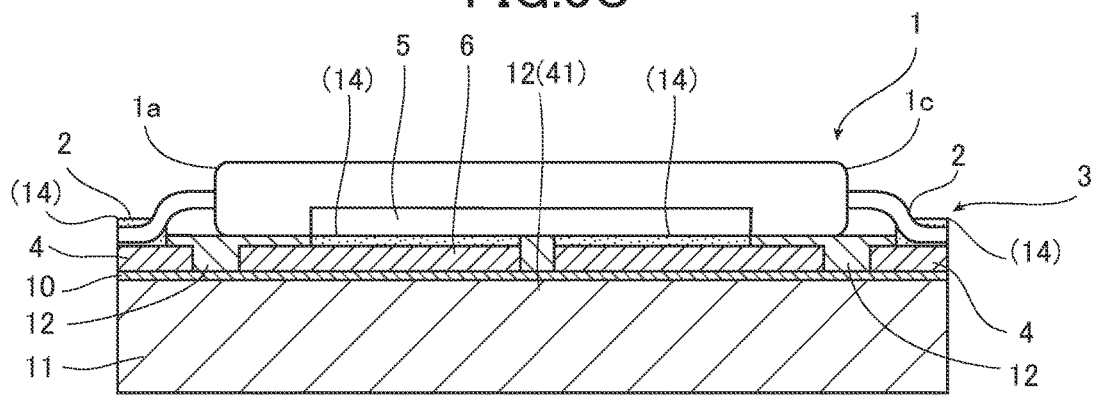
FIG. 3C is a cross-sectional view of the electronic component mounting structure after soldering the electronic component package on the electronic substrate.

As illustrated in FIGS. 3A-3C, the electronic substrate 3 is provided with a wiring pattern on a surface of a base material 11 with an insulation layer 10 provided therebetween. The lands 4 indicate parts to be soldered on the wiring pattern for the terminals 2. The metallic heat radiating pattern 6 indicates a part to be soldered on the wiring pattern for the chip heat radiating member 5. The lands 4 and the metallic heat radiating pattern 6 have affinity to the melted solder. The melted solder is hence raised from the surfaces of the lands 4 and the metallic heat radiating pattern 6 by the surface tension.

Figure 5:
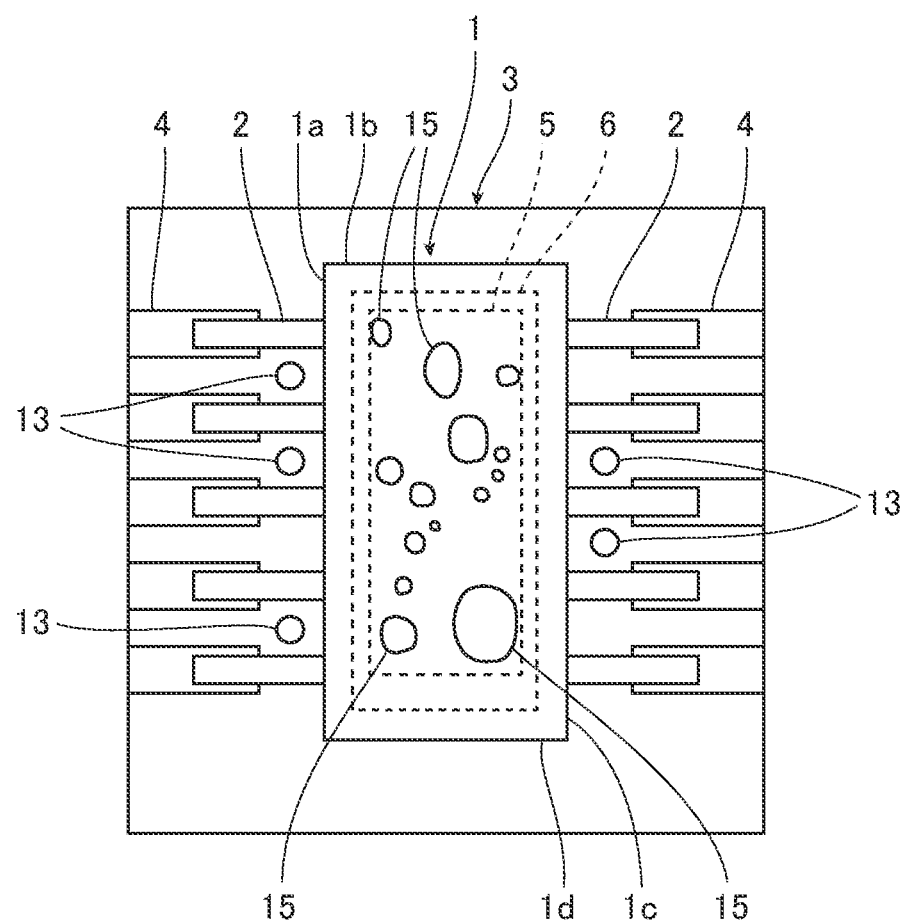
FIG. 5 is a plan view of an electronic component mounting structure in which a solder ball and/or a solder void are formed thereon.

Note that the region on the surface of the base material 11 other than the region formed with the wiring pattern is formed with an insulating protective coating such as a resist 12. The resist 12 has a property to repel the melted solder. Accordingly, when excessive solder protrudes outwardly from the electronic component package 1, the solder is repelled by the resist 12 and forms a solder ball 13, as illustrated in FIG. 5.

In a reflow method, the lands 4 and the metallic heat radiating pattern 6 are covered by a solder paste 14 using a mask (not illustrated), and then the terminals 2 of the electronic component package 1 and the chip heat radiating member 5 are placed on the lands 4 and the metallic heat radiating pattern 6, as illustrated in FIGS. 3A and 3B. Thereafter, the solder paste 14 is melted by applying heat such that the soldering joint is achieved, as illustrated in FIG. 3C. That is, the electronic component package 1 is disposed on the solder paste 14, i.e., above the surface of the lands 4 and the metallic heat radiating pattern 6. When the solder paste 14 melts, the electronic component package 1 sinks in the solder paste 14 by its own weight. As a result, the excessive solder of the solder paste 14 is forced out by and protrudes from the electronic component package 1. For the melting process of the solder paste 14, the entire electronic substrate 3 is heated by, for example, passing the electronic substrate 3 with the electronic component package 1 through a reflow furnace using a conveyor or the like. Alternatively, the solder paste 14 may be melted by blowing hot air, using heated steam, using infrared radiation, or using a laser.

The solder paste 14 is obtained by mixing solder powder with a paste. When the solder paste 14 is melted, the solder powder contained therein is bound to each other and grows to achieve the soldering joint. Here, air contained in the paste may gather and create an air bubble or even create a cavity 15 such as a solder void in the part of the soldering joint, as illustrated in FIG. 5. Although a mechanism to cause a cavity 15 has not been completely discovered, the cavity 15 may be created when the solder powder is not equally dispersed in the solder paste 14 or when the gas generated through the vaporization of the flux used as an adjuvant of the soldering joint is trapped in the joint. The cavity 15 may, for example, be formed when the solder is melted in an annular shape and an air bubble is trapped therein.

The chip heat radiating member 5 is a metal pad such as a bottom pad and/or a heat spreader. The chip heat radiating member 5 is formed flat on the back surface of the packaging resin of the electronic component package 1 or is formed as a surface that is slightly projected downwardly.

In addition to the above-mentioned basic configuration, the embodiment further includes the following configuration.

(1) As illustrated in FIGS. 1 and 2, the chip heat radiating member 5 is formed to be in a size that is covered from all directions by the packaging resin that forms the electronic component package 1. Further, the metallic heat radiating pattern 6 is formed such that at least a part of the metallic heat radiating pattern 6 is larger than the electronic component package 1. Specifically, the metallic heat radiating pattern 6 integrally includes a pattern extension part 22 that is connected to the metallic heat radiating pattern 6 and protruded from the electronic component package 1. The pattern extension part 22 thus guides the excessive solder 21 to outside of the electronic component package 1.

The chip heat radiating member 5 is installed on the back surface of the electronic component package 1 as a heat radiation plate. The electronic component package 1 has a rectangular shape in the plan view, and the chip heat radiating member 5 has a similar rectangular shape to the electronic component package 1 in the plan view. Further, the metallic heat radiating pattern 6 is formed on the circuit pattern of the electronic substrate 3 to radiate the heat therefrom and is smaller than the electronic component package 1 but larger than the chip heat radiating member 5. Note that it is preferable to apply the solder paste 14 in a smaller area than the metallic heat radiating pattern 6. The pattern extension part 22 is meant to guide the excessive solder 21 to outside of the electronic component package 1. Thus, the width of the pattern extension part 22 is narrower than one of the sides of the metallic heat radiating pattern 6, for example, narrower than the short side thereof, and the pattern extension part 22 is straightly extended from the metallic heat radiating pattern 6. As described later, the pattern extension part 22 is extended to an area where the lands 4 are not provided. For example, the pattern extension part 22 extends and forms a flag shape or a handle shape with respect to the rectangular-shaped metallic heat radiating pattern 6.

(2) As illustrated in FIG. 1, the pattern extension part 22 is provided on the side part 1b, 1d different from the side parts 1a, 1c in which the terminals 2 of the electronic component package 1 are provided. Alternatively, as illustrated in FIG. 2, the pattern extension part 22 may be provided at a position corresponding to the corner 31a-31d positioned between the side parts 1a-1d in which the terminals 2 of the electronic component package 1 are provided.

Here, the side part 1b, 1d different from the side parts 1a, 1c in FIG. 1 means that at least one of the side parts 1b, 1d of the electronic component package 1 other than the opposing side parts 1a, 1c in which the terminals 2 are provided. In this embodiment, the pattern extension part 22 is provided on the side part 1d. However, the pattern extension part 22 may be provided on the side part 1b or on the both side parts 1b, 1d.

Further, the corners 31a-31d in FIG. 2 mean that at least one of the four corners 31a-31d of the rectangular-shaped electronic component package 1 in which the terminals 2 are provided on two of the opposing side parts 1a-1d. In this embodiment, the pattern extension part 22 is provided at a position corresponding to the corner 31d.

(3) As illustrated in one of FIGS. 4A-4D, the metallic heat radiating pattern 6 and the pattern extension part 22 are provided with slit parts 41. The slit parts 41 suppress the formation of a cavity.

The slit parts 41 are preferably extended in an extending direction of the pattern extension part 22 (or, a direction being not toward the terminals 2) with respect to the metallic heat radiating pattern 6. With this, the slit parts 41 divide the metallic heat radiating pattern 6 and the pattern extension part 22 into several long-narrow small areas 42. Further, the slit parts 41 are formed with the insulating protective coating such as the resist 12, and the resist 12 has a property to repel the melted solder. Accordingly, the melted solder is repelled by the resist 12 provided inside the slit parts 41 and is raised upwardly by the surface tension on the small areas 42, which are divided by the slit parts 41. The widths of the slit parts 41 are preferably determined such that the melted solder hardly moves to the adjacent small area 42 through the slit part 41. Note that if the widths of the slit parts 41 are set narrower than the above size, the melted solder on each small area 42 may be connected to each other, and therefore a tunnel of an air layer may be formed in the connected solder at a position corresponding to the respective slit part 41.

Figure 4A:
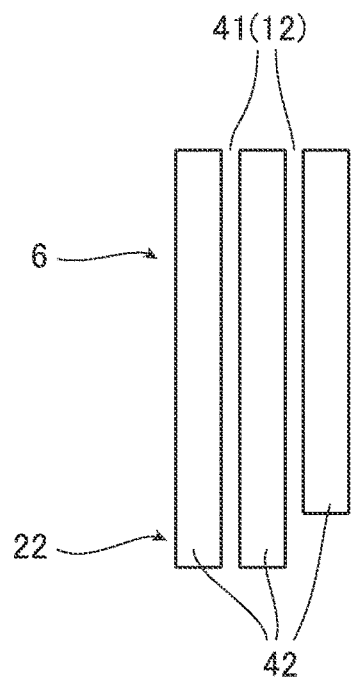
FIG. 4A is a plan view of a metallic heat radiating pattern and a pattern extension part in which slit parts extend in an entire extending direction of the pattern.

As illustrated in FIG. 4A, the slit parts 41 are, for example, shaped such that the slit parts 41 extend over the metallic heat radiating pattern 6 and the pattern extension part 22 along the extending direction thereof. Accordingly, the metallic heat radiating pattern 6 and the pattern extension part 22 are completely divided into the plurality of the long-narrow small areas 42.

Figure 4B:
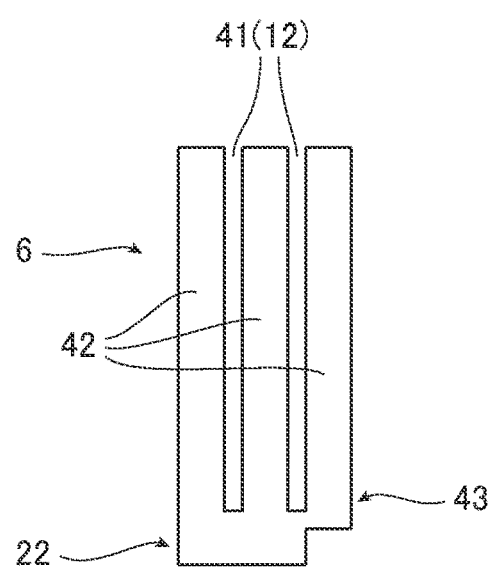
FIG. 4B is a plan view of the metallic heat radiating pattern and the pattern extension part in which the slit parts extend partially (specifically, the slit parts on one side are connected) in the extending direction of the pattern.
Figure 4C:
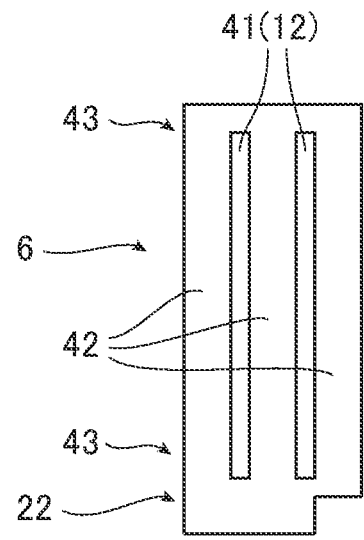
FIG. 4C is a plan view of the metallic heat radiating pattern and the pattern extension part in which the slit parts extend partially (specifically, the slit parts on the both sides are connected) in the extending direction of the pattern.

Alternatively, as illustrated in FIG. 4B or 4C, the slit parts 41 are, for example, shaped such that the slit parts 41 are partially extended to one side of the metallic heat radiating pattern 6 and the pattern extension part 22 along the extending direction thereof. Accordingly, the metallic heat radiating pattern 6 and the pattern extension part 22 are separated into a plurality of long-narrow small areas 42 which are partially connected to each other with a connection part 43.

Figure 4D:
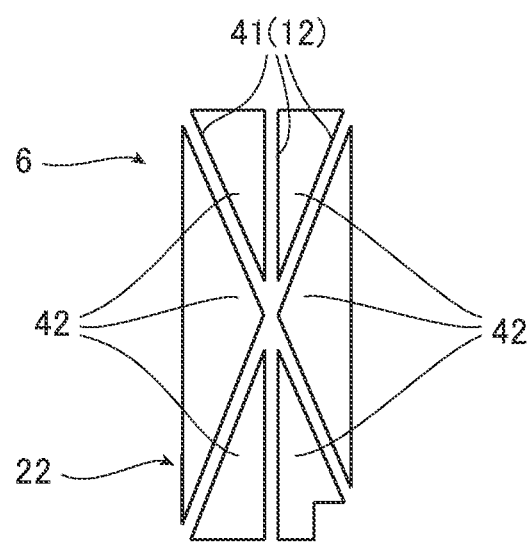
FIG. 4D is a plan view of the metallic heat radiating pattern and the pattern extension part in which a part of the slit parts is inclined.

Alternatively, as illustrated in FIG. 4D, the slit parts 41 are, for example, shaped to define a part extending in the extending direction of the metallic heat radiating pattern 6 and the pattern extension part 22 and a part slightly inclined with respect to the extending direction. Accordingly, the metallic heat radiating pattern 6 and the pattern extension part 22 are separated into a plurality of small areas 42 having acute angle triangle shapes spreading toward the outside of the electronic component package 1.

According to the embodiment, the following effects are obtained.

In the mounting structure of the electronic component package 1, the terminals 2 are projected from one of or some of the side parts 1a-1d of the electronic component package 1 and placed on the lands 4 provided on the electronic substrate 3 respectively. The terminals 2 are then soldered thereon by the reflow method. Further, the chip heat radiating member 5 provided on the back surface of the electronic component package 1 is placed on the metallic heat radiating pattern 6 provided on the electronic substrate 3 and soldered thereon by the reflow method.

By soldering the chip heat radiating member 5 on the metallic heat radiating pattern 6, the heat generated in the electronic component package 1 is efficiently transmitted to the electronic substrate 3.

(1) Here, the pattern extension part 22 is provided at the metallic heat radiating pattern 6. With this, when the amount of the solder supplied between the chip heat radiating member 5 and the metallic heat radiating pattern 6 is excessively large, the excessive solder 21 protruded from the metallic heat radiating pattern 6 is forcibly guided to the outside of the electronic component package 1 through the pattern extension part 22. Accordingly, it is possible to prevent the excessive solder 21 from randomly protruding from the side parts 1a-1d of the electronic component package 1 and hence prevent it from creating, for example, a solder ball 13, which is created when the randomly protruded excessive solder 21 is repelled on the resist 12 coating on the surface of the electronic substrate 3. As a result, it prevents the solder ball 13 from contacting the terminals 2 and/or the lands 4 to cause a short circuit.

(2) The pattern extension part 22 is provided on the side parts 1b, 1d different from the side parts 1a, 1c in which the terminals 2 of the electronic component package 1 are provided (see FIG. 1). Alternatively, the pattern extension part 22 may be provided at the position corresponding to the corner 31a-31d positioned between the side parts 1a-1d in which the terminals 2 of the electronic component package 1 are provided (see FIG. 2). Accordingly, the pattern extension part 22 is formed on the electronic substrate 3 without interfering with the lands 4. Therefore, it ensures to keep the excessive solder 21, which is guided to the pattern extension part 22, away from the lands 4.

(3) The metallic heat radiating pattern 6 and the pattern extension part 22 are provided with the slit parts 41. With the slit parts 41, the metallic heat radiating pattern 6 and the pattern extension part 22 are divided into several long-narrow small areas 42, and the total area of the metallic heat radiating pattern 6 and the pattern extension part 22 is reduced by the spaces of the slit parts 41. This allows the melted solder to easily permeate through the metallic heat radiating pattern 6 even if the applied amount of the solder paste 14 is relatively small. A cavity 15 is thus hardly formed in the solder. Further, since the cavity 15 is not able to grow greater than the width of the small areas 42, it is able to keep the size of the cavity 15 small. Alternatively, the cavity 15 is easily moved to the pattern extension part 22 along the small areas 42 and/or the slit parts 41. As a result, it prevents a deterioration of the heat radiation capability (or an increase on the heat radiation resistance) caused by a large cavity 15, thereby preventing the electronic component package 1 from increasing in temperature.

Further, when an inclined part is provided as the slit parts 41, the small areas 42 become an acute angle triangle shape. Accordingly, the cavity 15 is easily guided from a narrow space to a wider space.

As the small areas 42 and the slit parts 41 guide the excessive solder 21 to the pattern extension part 22, it is possible to suppress an occurrence of forming a solder ball 13 in the vicinity of the terminals 2 even when the amount of the applied solder paste 14 is excessively large.

Although the embodiment has been described with reference to the drawings, it should be understood that the embodiment is only an example of the present invention. The present invention should not be limited to the embodiment, and it should be appreciated that variations and modifications may be made in the embodiments described by persons skilled in the art without departing from the gist of the present invention. Further, when the embodiment includes a plurality of elements, any possible combinations of these elements may be possible even without a detailed description. Furthermore, when several embodiments are described in the present invention, any possible combinations of these configurations that may even across these embodiments may be possible even without a detailed description. Additionally, when the term "and the like", is used, it means it covers similar elements. Further, when the terms "substantially", "about", "around", etc. are used, it should be considered that they cover ranges and/or accuracy within a technical common sense understood by persons skilled in the art.

REFERENCE SIGNS LIST

1 Electronic Component Package, 1*a*-1*d* Side Part, 2 Terminal, 3 Electronic Substrate, 4 Land, 5 Chip Heat Radiating Member, 6 Metallic Heat Radiating Pattern, 21 Excessive Solder, 22 Pattern Extension Part, 31*a*-31*d* Corner, 41 Slit

The invention claimed is:

1. An electronic component mounting structure, comprising:
   a terminal projecting from a side part of an electronic component package; and
   a chip heat radiating member that is on a back surface of the electronic component package,
   wherein:
   the terminal is on a land on an electronic substrate and is soldered thereon by a reflow method,
   the chip heat radiating member is on a metallic heat radiating pattern on the electronic substrate and is soldered thereon by the reflow method,
   the chip heat radiating member is formed to be a size that is covered from all directions by a packaging resin, the packaging resin forming the electronic component package,
   the metallic heat radiating pattern integrally comprises a pattern extension part that is connected to the metallic heat radiating pattern and protrudes from the electronic component package, such that at least a part of the metallic heat radiating pattern is formed to be larger than the electronic component package,
   the pattern extension part is configured to guide excessive solder to an outside of the electronic component package,
   at least the metallic heat radiating pattern includes a slit part configured to suppress formation of a cavity,
   the slit part is configured to repel melted solder,
   the slit part extends in an extending direction of the pattern extension part and divides the metallic heat radiating pattern into a plurality of elongated areas, and
   the elongated areas are connected to each other at a first end on an pattern extension side with a connection part but are not connected at a second end opposite to the pattern extension side.

2. The electronic component mounting structure according to claim 1, wherein the pattern extension part is on a side part different from the side part of the electronic component package from which the terminal projects, or
   the pattern extension part is at a position corresponding to a corner of the electronic component package.

3. The electronic component mounting structure according to claim 1, wherein a width of the slit part is set such that the melted solder does not move between both sides of the slit part.

4. The electronic component mounting structure according to claim 1, wherein the slit part is inclined with respect to the extending direction of the pattern extension part.

* * * * *